3,523,358

PROCESS FOR PRODUCING A VACUUM TIGHT SUPRA-CONDUCTING JOINT BY DIFFUSION SOLDERING

Hildebrand Zimmer, Hamburg, and Rolf-Dieter Böhnke, Hamburg, Lokstedt, Germany, assignors, by mesne assignments, to U.S. Philips Corporation, New York, N.Y., a corporation of Delaware, No Drawing. Filed Sept. 26, 1967, Ser. No. 670,748
Claims priority, application Germany, Oct. 7, 1966, P 40,520
Int. Cl. B23k *31/02*
U.S. Cl. 29—498 1 Claim

ABSTRACT OF THE DISCLOSURE

A process of producing by diffusion soldering a vacuum-tight joint between metal parts covered with super-conducting lead layers. The surface of one part is completely covered with a lead layer while the surface of the other part is covered, except for a junction area, with a lead layer. The junction area is covered with a gold layer having a thickness such that it forms an alloy with lead having a eutectic composition when the parts are pressed together and heated. In order to prevent spreading of the lead on the surface of the second part, the parts are heated to only 240° C. to diffusion bond the gold and the lead covered first part.

The present invention relates to a process for producing a vacuum tight supra-conducting joint between metal parts which are covered with supra-conducting lead layers by diffusion soldering.

In the manufacture of supra-conducing devices the problem frequently arises to hermetically seal a hollow body consisting of several parts the inner surface of which are covered with an electrolytically applied lead layer. When the parts are bonded by soldering it is essential that the high frequency conductivity of the soldered joint is not much poorer than the supra-conductivity of the lead layer. The temperature at which the soldering takes place must not exceed the melting point of lead and no soldering flux must be used. It is further required that no redundant molten solder will spread over the surface of the lead layers.

The common processes for bonding by melting solder do not meet these requirements. In particular it is practically impossible to prevent molten solder from spreading over the lead surface. Consequently, these processes are not suitable for the present purpose.

According to the invention a proper joint of the above mentioned kind is obtained by a diffusion soldering process, if, according to this invention, the surface of the first part is covered completely, the surface of the second part almost completely, viz., with the exception of its junction area, with a lead layer, and that the junction area of the second part is covered with a gold layer having such a thickness in proportion to the thickness of the lead layer on the junction area of the first part, that the gold-lead alloy to be formed is of eutectic composition, whereafter the parts are pressed together and are bonded by diffusion soldering at a temperature of 240° C.

A soldering process by diffusion for bonding metal parts covered with gold layers has been described in the French patent specification 1,102,193. According to this known process the junction areas of the metal parts are covered, for instance electrolytically, with a gold layer and are bonded by pressing and/or heating.

If necessary the process can be carried out in a protective or reducing gas atmosphere. This process however does not solve the problems which arise when two metal parts covered with supra-conducting lead layers are to be bonded by a vacuum tight supra-conducting joint.

In carrying out the process according to the invention the solder is produced previous to melting, by diffusion of the components lead and gold, separately applied to the junction areas of the two parts. The melting point of the solder so formed is lower than the melting points each of the two components, provided, that the melting diagram shows a well defined eutectic composition. As the components on the two parts are as yet separated the result is that the melting zone is restricted to the contact area between the parts. Consequently, the solder will not spread over other open surfaces.

In carrying out the process one of the parts, which may be made of any metal such as copper, is electrolytically completely covered with a lead layer; the other part is also covered with a lead layer however, with the exception of the junction area which is covered with a gold layer.

The thickness of this gold layer in proportion to the thickness of the lead layer on the junction area of the other part is so chosen, that the ratio of mixture of the alloy is 15 weight percent gold and 85 weight percent lead. The melting point of the eutectic alloy is 215° C., whereas the melting point of pure gold resp. of pure lead amounts to 1063° C. resp. 327° C. The two parts are pressed together and heated to 240° C. In this way a firm bond is established between the two parts, which bond is at the same time vacuum tight and supra-conducting.

What is claimed is:

1. A process for producing by diffusion soldering a vacuum tight supra-conducting joint between metal parts which are covered with super-conducting lead layers, comprising the steps of completely covering the surface of the first part with a lead layer, covering the surface of the second part except for a junction area with a lead layer, covering the junction area of the second part with a gold layer having a thickness in proportion to the thickness of the lead layer on the area of the first part opposite the junction area which forms with the lead an alloy having a eutectic composition, thereafter pressing the parts together and bonding the parts by diffusion soldering at a temperature of 240° C.

References Cited

UNITED STATES PATENTS

| | | | |
|---|---|---|---|
| 3,115,612 | 12/1963 | Meissner | 29—599 |
| 3,449,818 | 6/1969 | Lowe et al. | 29—502 X |
| 2,220,961 | 11/1940 | Kern | 75—166 |
| 3,169,048 | 2/1965 | McGinn | 29—199 X |

FOREIGN PATENTS

| | | |
|---|---|---|
| 359,008 | 1/1962 | Switzerland. |

JOHN F. CAMPBELL, Primary Examiner

R. J. SHORE, Assistant Examiner

U.S. Cl. X.R.

29—502, 504, 599, 199